US012622248B2

(12) United States Patent
Motoyama et al.

(10) Patent No.: US 12,622,248 B2
(45) Date of Patent: May 5, 2026

(54) INTERCONNECTS WITH SIDEWALL BARRIER LAYER DIVOT FILL

(71) Applicant: International Business Machines Corporation, Armonk, NY (US)

(72) Inventors: Koichi Motoyama, Clifton Park, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 492 days.

(21) Appl. No.: 18/079,440

(22) Filed: Dec. 12, 2022

(65) Prior Publication Data

US 2024/0194587 A1      Jun. 13, 2024

(51) Int. Cl.
   *H10W 20/41*       (2026.01)
   *H10W 20/00*       (2026.01)
   *H10W 20/45*       (2026.01)
   *H10W 20/42*       (2026.01)

(52) U.S. Cl.
   CPC ....... *H10W 20/076* (2026.01); *H10W 20/033* (2026.01); *H10W 20/037* (2026.01); *H10W 20/056* (2026.01); *H10W 20/084* (2026.01); *H10W 20/425* (2026.01); *H10W 20/455* (2026.01); *H10W 20/42* (2026.01)

(58) Field of Classification Search
   CPC ......... H01L 21/76831; H01L 21/76849; H01L 21/76843; H10W 20/455
   See application file for complete search history.

(56) References Cited

U.S. PATENT DOCUMENTS

| | | | | |
|---|---|---|---|---|
| 7,414,314 B2 * | 8/2008 | Abe | .................... | H01L 21/2885 |
| | | | | 257/E21.585 |
| 7,944,053 B2 * | 5/2011 | Usui | ................. | H01L 21/76831 |
| | | | | 257/750 |
| 7,973,409 B2 * | 7/2011 | Yang | ................. | H01L 21/76831 |
| | | | | 257/762 |
| 8,299,617 B2 | 10/2012 | Morrow et al. | | |
| 8,841,769 B2 * | 9/2014 | Park | ................. | H01L 21/76832 |
| | | | | 438/653 |
| 9,324,650 B2 | 4/2016 | Edelstein et al. | | |
| 9,548,243 B1 | 1/2017 | Briggs et al. | | |
| 9,553,019 B1 | 1/2017 | Briggs et al. | | |
| 9,806,023 B1 | 10/2017 | Briggs et al. | | |

(Continued)

*Primary Examiner* — Daniel Luke
(74) *Attorney, Agent, or Firm* — L. Jeffrey Kelly

(57) ABSTRACT

Dual-damascene fully-aligned via interconnects with divot fill are provided. In one aspect, an interconnect structure includes: a first interlayer dielectric disposed on a wafer; a metal line(s) embedded in the first interlayer dielectric, where a top surface of the metal line(s) is recessed below a top surface of the first interlayer dielectric; a second interlayer dielectric disposed on the first interlayer dielectric; a conductive via(s) embedded in the second interlayer dielectric and aligned with the metal line(s); a barrier layer along a bottom and a first portion of a sidewall of the metal line(s); and a protective dielectric layer along a second portion of the sidewall of the metal line(s), where the barrier layer and the protective dielectric layer fully separate the metal line(s) from the first interlayer dielectric. A metal cap can be disposed on the metal line(s). A method of fabricating an interconnect structure is also provided.

19 Claims, 11 Drawing Sheets

(56) References Cited

U.S. PATENT DOCUMENTS

| | | | |
|---|---|---|---|
| 9,953,865 B1 | 4/2018 | Briggs et al. | |
| 10,276,436 B2 | 4/2019 | Briggs et al. | |
| 11,018,087 B2 * | 5/2021 | Patlolla | H01L 21/76834 |
| 11,062,943 B2 * | 7/2021 | Motoyama | H01L 21/31144 |
| 11,152,257 B2 | 10/2021 | Lanzillo et al. | |
| 2009/0039512 A1 * | 2/2009 | Yang | H01L 21/76883 |
| | | | 438/653 |
| 2009/0200668 A1 * | 8/2009 | Yang | H01L 21/76883 |
| | | | 438/622 |
| 2019/0019726 A1 | 1/2019 | Ryan et al. | |
| 2021/0193189 A1 * | 6/2021 | Ahmed | H01L 21/76883 |

* cited by examiner recess 402                              402                              402

(follows from FIG. 7)

INTERCONNECTS WITH SIDEWALL BARRIER LAYER DIVOT FILL

BACKGROUND

The present invention relates to semiconductor device interconnects, and more particularly, to dual damascene, fully aligned via interconnects where barrier layer divots are filled with dielectric material.

Interconnects in a semiconductor device serve as connections between various components, both horizontally and vertically amongst different levels of the device design. Interconnects are often formed from conductors such as copper using a so-called dual-damascene process.

Fully aligned via techniques have been proposed to reduce interconnect resistance by confining the via to the metal line below. Doing so, however, can undesirably lead to breaks in the sidewall barrier alongside the metal line, forming pathways for copper to diffuse into the surrounding dielectric. Diffusion of copper into the surrounding dielectric causes leakage issues.

Therefore, dual damascene techniques for forming fully aligned vias with complete sidewall protection to prevent metal diffusion would be desirable.

SUMMARY

The present invention provides dual damascene, fully aligned via interconnects where divots in the barrier layer are filled with dielectric material. In one aspect of the invention, an interconnect structure is provided. The interconnect structure includes: a first interlayer dielectric disposed on a wafer; at least one metal line embedded in the first interlayer dielectric, where a top surface of the at least one metal line is recessed below a top surface of the first interlayer dielectric; a second interlayer dielectric disposed on the first interlayer dielectric; at least one conductive via embedded in the second interlayer dielectric, where the at least one conductive via is aligned with the at least one metal line; a barrier layer along a bottom and a first portion of a sidewall of the at least one metal line; and a protective dielectric layer along a second portion of the sidewall of the at least one metal line, where the barrier layer and the protective dielectric layer fully separate the at least one metal line from the first interlayer dielectric. For instance, the protective dielectric layer can include a material selected from: silicon nitride (SiN), silicon oxynitride (SiON), silicon carbon nitride (SiCN), silicon oxycarbonitride (SiOCN), and combinations thereof.

In another aspect of the invention, another interconnect structure is provided. The interconnect structure includes: a first interlayer dielectric disposed on a wafer; at least one metal line embedded in the first interlayer dielectric, where a top surface of the at least one metal line is recessed below a top surface of the first interlayer dielectric; a metal cap disposed on the at least one metal line; a second interlayer dielectric disposed on the first interlayer dielectric; at least one conductive via embedded in the second interlayer dielectric, where the at least one conductive via is aligned with the at least one metal line; a barrier layer along a bottom and a first portion of a sidewall of the at least one metal line; and a protective dielectric layer along a second portion of the sidewall of the at least one metal line, where the barrier layer and the protective dielectric layer fully separate the at least one metal line from the first interlayer dielectric.

In yet another aspect of the invention, a method of fabricating an interconnect structure is provided. The method includes: depositing a first interlayer dielectric onto a wafer; forming at least one metal line in the first interlayer dielectric, where the at least one metal line is separated from the first interlayer dielectric by a barrier layer; recessing the at least one metal line such that a top surface of the at least one metal line is below a top surface of the first interlayer dielectric, where the recessing creates divots in the barrier layer; forming a protective dielectric layer in the divots, where the barrier layer is present along a bottom and a first portion of a sidewall of the at least one metal line, and the protective dielectric layer is present along a second portion of the sidewall of the at least one metal line, and where the barrier layer and the protective dielectric layer fully separate the at least one metal line from the first interlayer dielectric; depositing a second interlayer dielectric onto the first interlayer dielectric; and forming at least one conductive via in the second interlayer dielectric, where the at least one conductive via is aligned with the at least one metal line.

A more complete understanding of the present invention, as well as further features and advantages of the present invention, will be obtained by reference to the following detailed description and drawings.

BRIEF DESCRIPTION OF THE DRAWINGS

FIG. 5 is a cross-sectional diagram illustrating the first barrier layer having been recessed causing the formation of divots along the (upper) sidewalls of the metal lines according to an embodiment of the present invention;

FIG. 6 is a cross-sectional diagram illustrating a protective dielectric material having been deposited onto the first interlayer dielectric and the metal lines, filling the divots, according to an embodiment of the present invention;

DETAILED DESCRIPTION

Dual damascene, fully aligned via processes involve a recess of the lower metal lines, which can cause divots to form in the barrier layer along the upper sidewall of the metal lines. Unless this artifact of the recess etch is corrected, these divots provide a pathway for the interconnect metal to diffuse into the surrounding dielectric, which undesirably leads to leakage issues. Advantageously, the present techniques employ a follow-up sidewall barrier layer divot fill in order to provide a complete protective barrier along the metal lines that prevents any metal diffusion.

Figure 1:
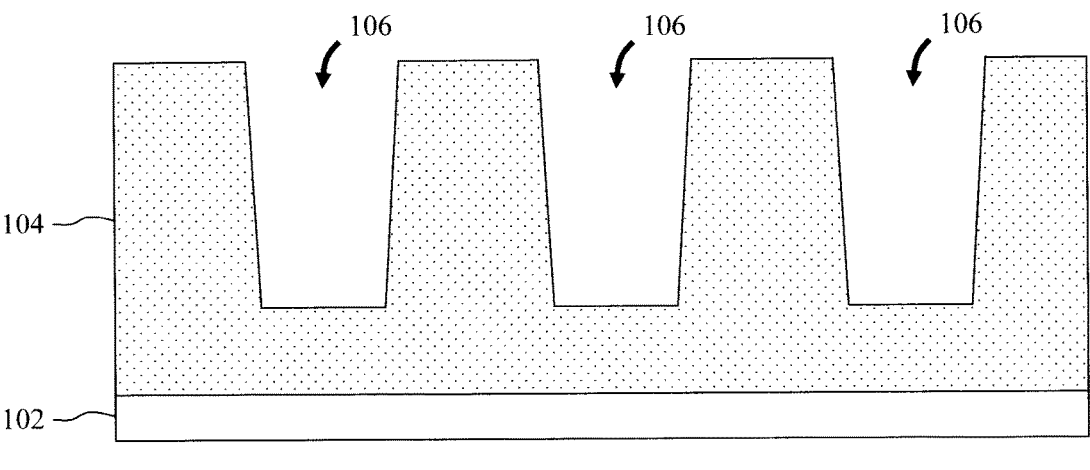
FIG. 1 is a cross-sectional diagram illustrating a (first) interlayer dielectric having been deposited onto a wafer, and trenches having been patterned in the first interlayer dielectric according to an embodiment of the present invention.

For instance, an exemplary methodology for forming interconnects in accordance with the present techniques is now described by way of reference to FIGS. 1-13. As shown in FIG. 1, the process begins with the deposition of an interlayer dielectric 104 onto a wafer 102, and patterning of trenches 106 in the interlayer dielectric 104. According to an exemplary embodiment, the wafer 102 is a bulk semiconductor wafer, such as a bulk silicon (Si), bulk germanium (Ge), bulk silicon germanium (SiGe) and/or bulk III-V semiconductor wafer. Alternatively, the wafer 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor.

Further, the wafer 102 may already have pre-built structures (not shown) such as transistors, diodes, capacitors, resistors, interconnects, wiring, etc.

Suitable interlayer dielectric 104 materials include, but are not limited to, silicon oxycarbide (SiOC), hydrogen-containing silicon oxycarbide (SiCOH), silicon oxycarbonitride (SiCNO) and/or hydrogen-containing silicon oxycarbonitride (SiCHNO) and/or oxide low-K materials such as silicon oxide (SiOx) and/or oxide ultralow-K interlayer dielectric (ULK-ILD) materials, e.g., having a dielectric constant k of less than 2.7, which can be deposited using a process such as chemical vapor deposition (CVD), plasma enhanced chemical vapor deposition (PECVD), atomic layer deposition (ALD), physical vapor deposition (PVD) or a casting process such as spin-coating. Suitable ultralow-K dielectric materials include, but are not limited to, porous organosilicate glass (pSiCOH). Following deposition, the interlayer dielectric 104 can be planarized using a process such as chemical-mechanical polishing.

Standard lithography and etching processes can be used to pattern the trenches 106 in the interlayer dielectric 104. With standard lithography and etching techniques, a lithographic stack (not shown), e.g., photoresist/anti-reflective coating/organic planarizing layer, is used to pattern a hardmask (not shown) with the footprint and location of the trenches 106. An etching process such as reactive ion etching can then be used to transfer the pattern from the hardmask to the interlayer dielectric 104.

As shown in FIG. 1, the trenches 106, as patterned, extend partway through the interlayer dielectric 104. To look at it another way, a portion of the interlayer dielectric 104 remains below the trenches 106, separating the trenches 106 from the underlying wafer 102. The trenches 106 are formed as part of a damascene process for metallization. With a damascene process, features (in this case the trenches 106) are first patterned in a dielectric (in this case the interlayer dielectric 104). The features are then filled with a metal(s) (see below).

Figure 2:
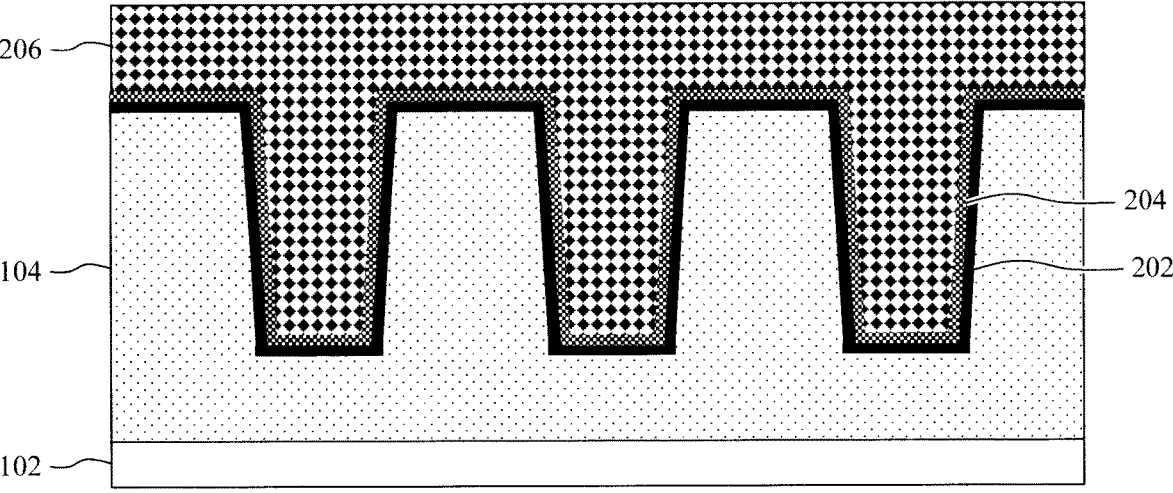
FIG. 2 is a cross-sectional diagram illustrating a (first) barrier layer having been deposited onto the first interlayer dielectric and into/lining the trenches, a (first) liner having been deposited onto the first barrier layer, and a (first) fill metal having been deposited onto the first liner and filling the trenches according to an embodiment of the present invention.

Namely, as shown in FIG. 2, a barrier layer 202 is deposited onto the interlayer dielectric 104 and into/lining the trenches 106, a liner 204 is deposited onto the barrier layer 202, and a fill metal 206 is deposited onto the liner 204 and filling the trenches 106. The barrier layer 202 and liner 204 conform to the topography of the interlayer dielectric 104 thus fully lining the bottom and sidewalls of the trenches 106. Suitable barrier layer 202 materials include, but are not limited to, titanium (Ti), tantalum (Ta), titanium nitride (TiN) and/or tantalum nitride (TaN), which can be deposited using a process such as ALD. According to an exemplary embodiment, the barrier layer 202 has a thickness of from about 1 nanometer (nm) to about 3 nm. The barrier layer 202 serves to prevent diffusion of the fill metal 206 into the surrounding interlayer dielectric 104. However, as will be described in detail below, a subsequent recess etch can open up divots in the barrier layer 202 which, unless remedied, provide a pathway for metal to diffuse out from the interconnect.

Suitable liner 204 materials include, but are not limited to, cobalt (Co), tungsten (W) and/or ruthenium (Ru), which can be deposited using a process such as ALD. According to an exemplary embodiment, the liner 204 has a thickness of from about 1 nm to about 3 nm. The liner 204 facilitates deposition of the fill metal 206 into the trenches 106.

Suitable fill metals 206 include, but are not limited to, copper (Cu), Co, W and/or Ru, which can be deposited using a process such as evaporation, sputtering, or electrochemical plating. As shown in FIG. 2, the fill metal 206, as deposited, overfills the trenches 106, and thus is present over the top surface of the interlayer dielectric 104. However, the fill metal 206 overburden will next be removed.

Figure 3:
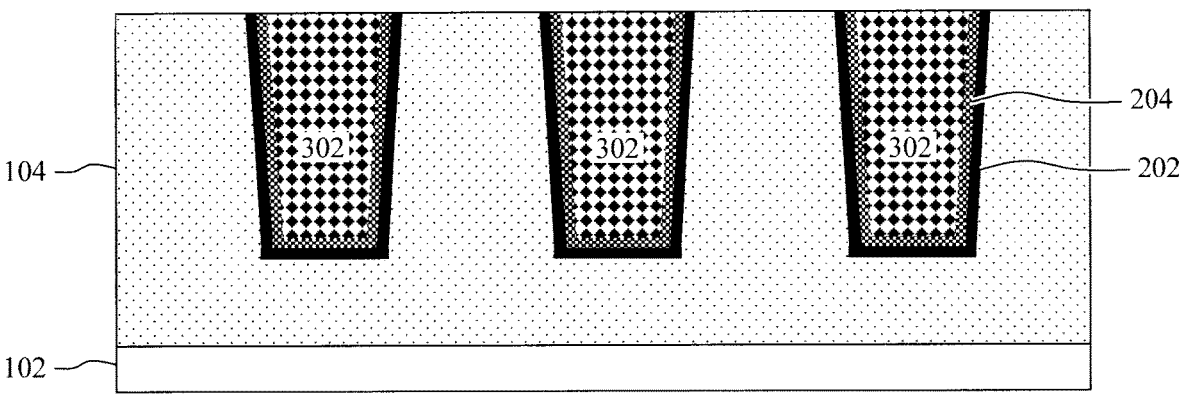
FIG. 3 is a cross-sectional diagram illustrating the first fill metal having been planarized to form metal lines in the trenches that are embedded in the first interlayer dielectric according to an embodiment of the present invention.

Namely, as shown in FIG. 3 the fill metal 206 is planarized down to the top surface of the interlayer dielectric 104, thereby forming distinct metal lines 302 in the trenches 106. The metal lines 302 are embedded in the interlayer dielectric 104. Planarization of the fill metal 206 can be performed using a process such as chemical-mechanical polishing. As shown in FIG. 3, this planarization also serves to remove the barrier layer 202 and the liner 204 from the top surface of the interlayer dielectric 104. Thus, at this point in the process, the top surface of the metal lines 302 is coplanar with the top surface of the interlayer dielectric 104. However, a recess of the metal lines 302 will next be performed.

Figure 4:
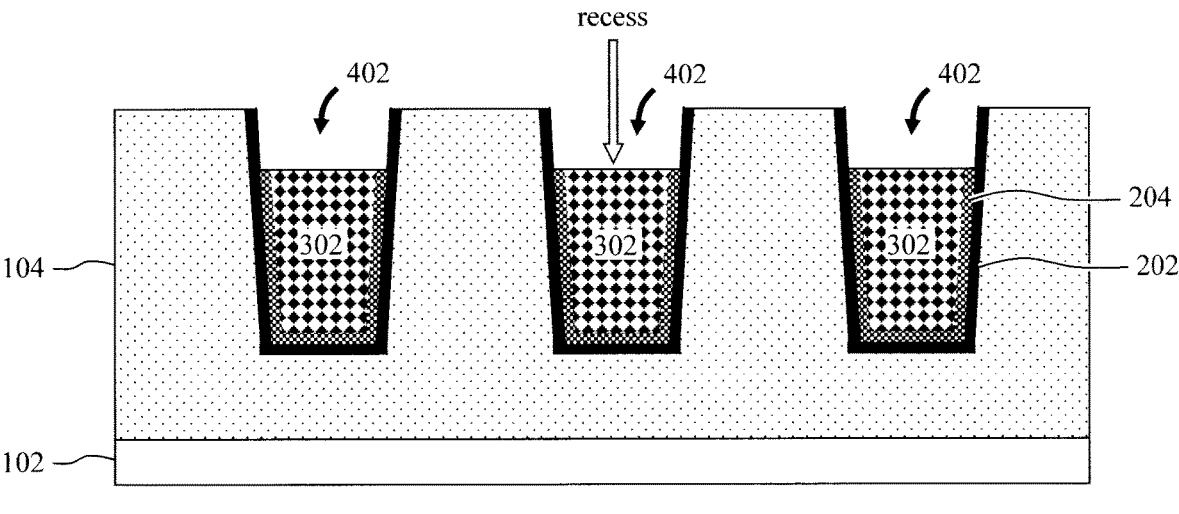
FIG. 4 is a cross-sectional diagram illustrating the metal lines and the first liner having been recessed which creates gaps over each of the metal lines according to an embodiment of the present invention.

Namely, as shown in FIG. 4, an etch of the metal lines 302 is performed which recesses the top surface of the metal lines 302 below the top surface of the interlayer dielectric 104. A metal-selective etching process can be employed for this recess etch. As shown in FIG. 4, a metal-selective etch process will also recess the liner 204. Gaps 402 are now present over each of the metal lines 302.

Figures 5, 6:
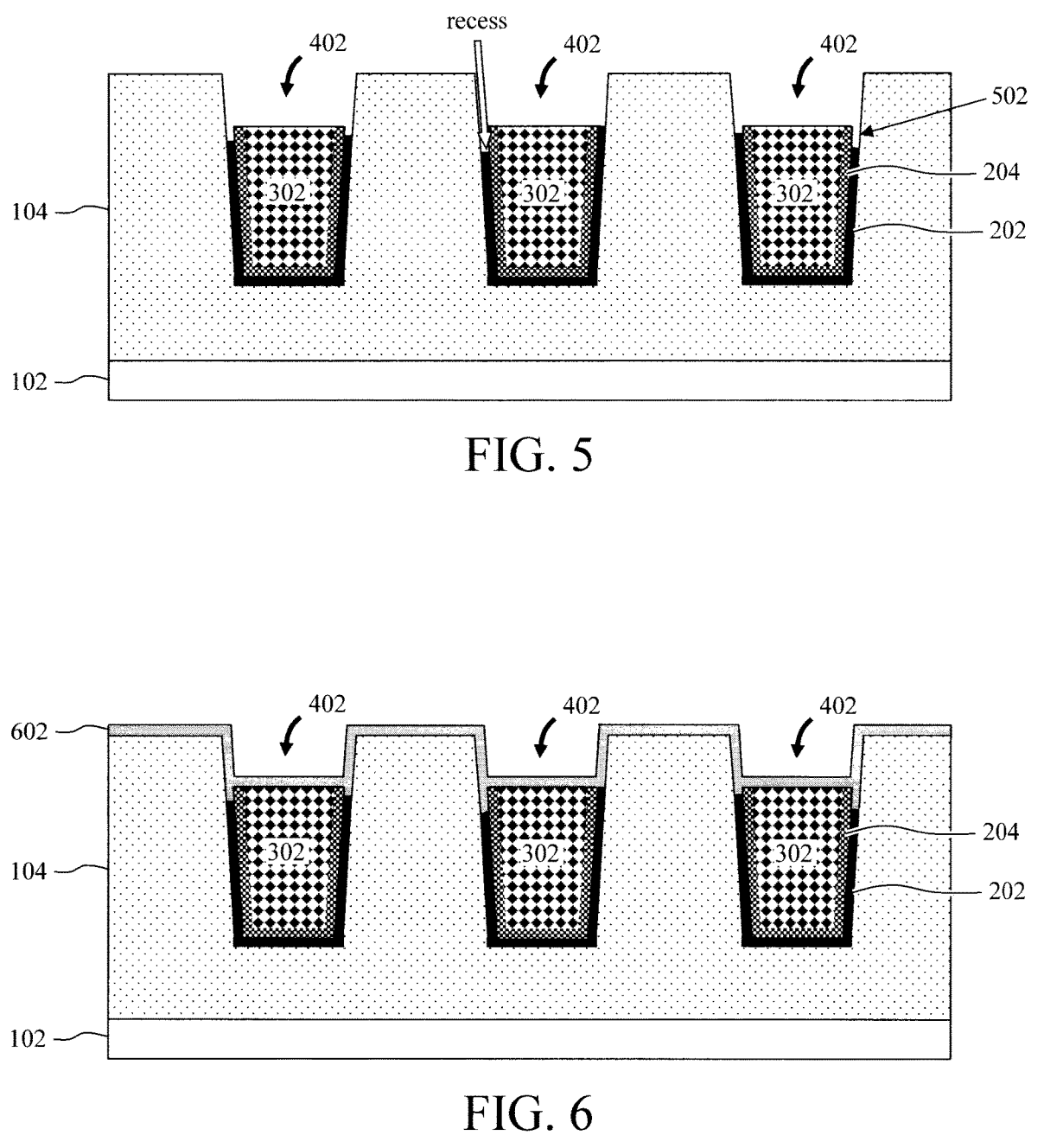

As shown in FIG. 5, the barrier layer 202 is then recessed. An isotropic etching process such as a selective wet chemical etch can be employed to recess the barrier layer 202. Ideally, the barrier layer 202 would be recessed by the same amount as the metal lines 302 such that the barrier layer 202 would remain fully surrounding the (bottom and sidewalls) of the (recessed) metal lines 302. Namely, as noted above, the barrier layer 202 serves to prevent diffusion of the fill metal 206 into the surrounding interlayer dielectric 104. To do so, the barrier layer 202 (and/or some other protective layer-see below) needs to completely separate the metal lines 302 from the interlayer dielectric 104. However, based on the selectivity and endpoint control of the etching process (such as a greater etch rate of the thin barrier layer 202 versus the bulk material of the metal lines 302), it is more than likely that the barrier layer 202 will in fact be recessed below the top surface of the metal lines 302. As shown in FIG. 5, this overetch of the barrier layer 202 creates divots 502 along the (upper) sidewalls of the metal lines 302 at the tops of the metal lines 302. Being an artifact of the etching process, the divots 502 may not be uniform across the metal lines 302 (e.g., divots 502 are shown in FIG. 5 having different depths). Unless remedied, these divots 502 can undesirably serve as a pathway for metal diffusion out into the surrounding interlayer dielectric 104.

However, as shown in FIG. 6, a protective dielectric material 602 is next deposited onto the interlayer dielectric 104 and the metal lines 302, filling the divots 502. Suitable protective dielectric materials 602 include, but are not limited to, silicon nitride (SiN), silicon oxynitride (SiON), silicon carbon nitride (SiCN) and/or silicon oxycarbonitride (SiOCN), which can be deposited using a process such as ALD. Nitrogen-containing materials such as the foregoing dielectrics provide a good barrier property against metal diffusion. The divots 502 are now filled with a material that (along with the barrier layer 202) will prevent diffusion of metal out from the metal lines 302 into the interlayer dielectric 104. According to an exemplary embodiment, the protective dielectric material 602 is a different material from the barrier layer 202.

Figure 7:
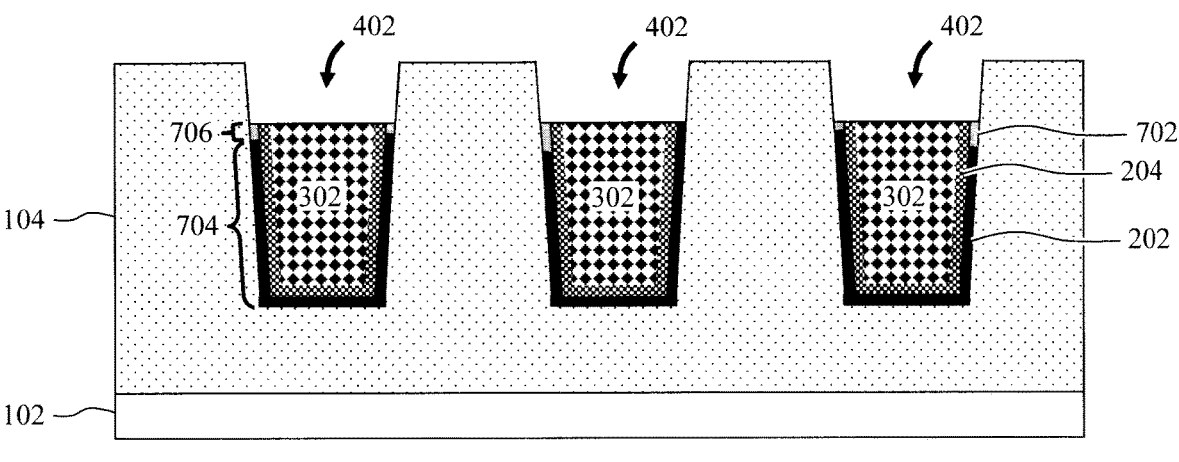
FIG. 7 is a cross-sectional diagram illustrating an etch-back of the protective dielectric material having been performed which forms a protective dielectric layer in the divots along the (upper) sidewall of the metal lines according to an embodiment of the present invention.

As shown in FIG. 7, an etch-back of the protective dielectric material 602 is next performed to remove the protective dielectric material 602 from the surfaces of the interlayer dielectric 104 and the metal lines 302. A non-directional (i.e., isotropic) etching process such as a wet chemical etch can be employed for etching back the protective dielectric material 602. Following the etch, all that remains of the protective dielectric material 602 is that which was deposited into the divots 502 and which now forms a protective dielectric layer 702 along the (upper) sidewall of the metal lines 302. To look at it another way, the barrier layer 202 is present along the bottom and a first (lower) portion 704 of the sidewalls of the metal lines 302. The protective dielectric layer 702 is present along a second (upper) portion 706 of the sidewalls of the metal lines 302. Thus, the protective dielectric layer 702 along with the barrier layer 202 completely surround the bottom and sidewalls of the metal lines 302, and collectively, fully separate the metal lines 302 from the interlayer dielectric 104. As such, any risk of metal diffusion out from the metal lines 302 into the surrounding interlayer dielectric 104 (including via the divots 502) is avoided altogether.

Metallization to form self-aligned vias over the metal lines 302 is then performed. It is notable that an optional metal cap may first be formed on the metal lines 302. Use of a metal cap can help to improve electromigration performance of Cu interconnects at advanced nodes. An alternative embodiment implementing a metal cap over the metal lines 302 in the interconnect architecture will be described in detail below. For other alternative metal interconnects such as Co, Ru, and W, a metal cap may not be required since they have a high enough melting point which should lead to adequate electromigration performance.

Figure 8:
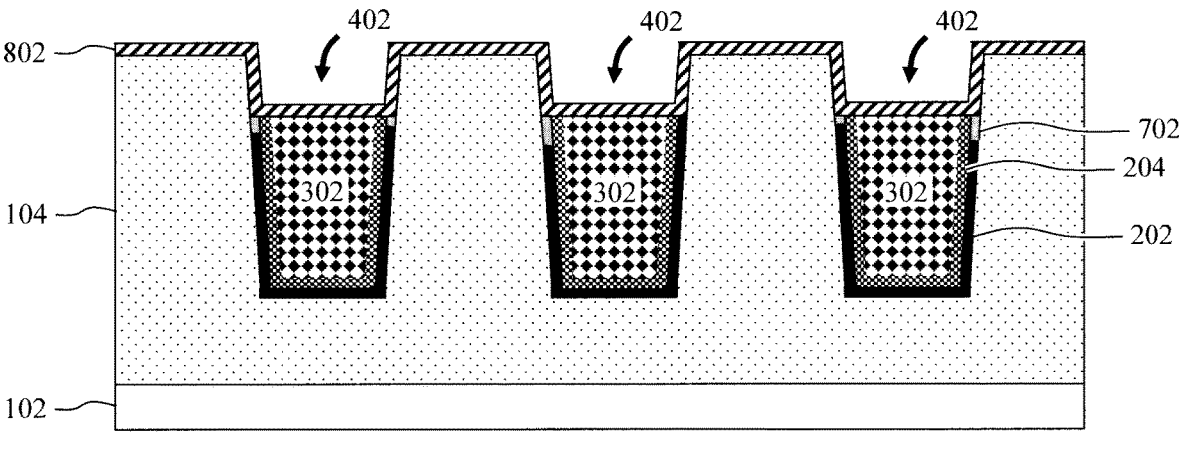
FIG. 8 is a cross-sectional diagram illustrating a dielectric cap having been deposited onto the first interlayer dielectric and the metal lines, lining the gaps, according to an embodiment of the present invention.

In this case, however, as shown in FIG. 8 metallization over the metal lines 302 begins with the deposition of a dielectric cap 802 onto the interlayer dielectric 104 and the metal lines 302, lining the gaps 402. Suitable dielectric cap 802 materials include, but are not limited to, aluminum oxide (AlOx), SiN, silicon carbide (SIC), SiCN, silicon oxycarbide (SiCO) and/or SiON, which can be deposited using a process such as CVD, ALD or PVD. According to an exemplary embodiment, the dielectric cap 802 has a thickness of from about 2 nm to about 5 nm. Further, while depicted as a single layer in the figures, dielectric cap 802 can also be configured as a multi-layer stack (e.g., a bilayer, trilayer, etc.) with each layer containing one or more of the materials provided above. Like the barrier layer 202 and protective dielectric layer 702, dielectric cap 802 will prevent diffusion of metal into the surrounding dielectric. As will be described in detail below, dielectric cap 802 will also act as an etch stop during the subsequent patterning of dual damascene features over the metal lines 302.

Figure 9:
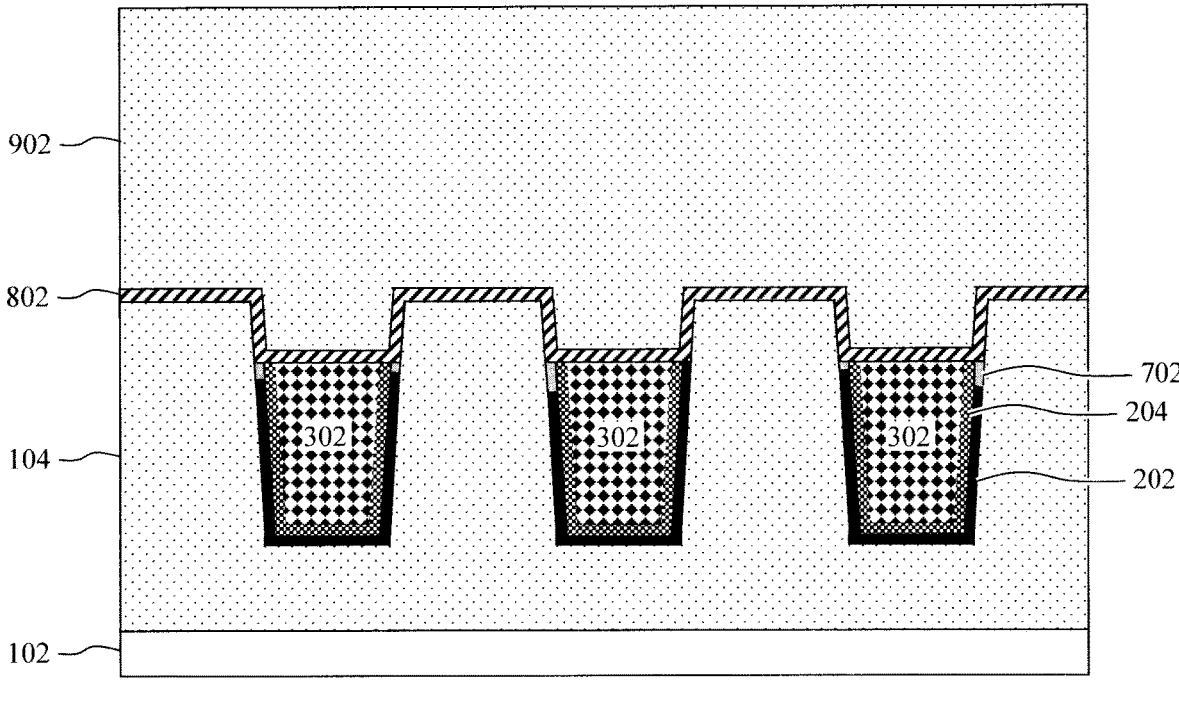
FIG. 9 is a cross-sectional diagram illustrating a (second) interlayer dielectric having been deposited onto the first interlayer dielectric over the dielectric cap and filling the gaps according to an embodiment of the present invention.

An interlayer dielectric 902 is then deposited onto the interlayer dielectric 104 over the dielectric cap 802 and filling the gaps 402. For clarity, the terms 'first' and 'second' may also be used herein when referring to the interlayer dielectric 104 and the interlayer dielectric 902, respectively. As shown in FIG. 9, the dielectric cap 802 separates the interlayer dielectric 104 from the interlayer dielectric 902. Suitable interlayer dielectric 902 materials include, but are not limited to, SiOC, SiCOH, SiCNO and/or SICHNO and/or oxide low-K materials such as SiOx and/or ULK-ILD materials such as pSiCOH, which can be deposited using a process such as CVD, PECVD, ALD, PVD or a casting process such as spin-coating. Following deposition, the interlayer dielectric 902 can be planarized using a process such as chemical-mechanical polishing.

Figure 10:
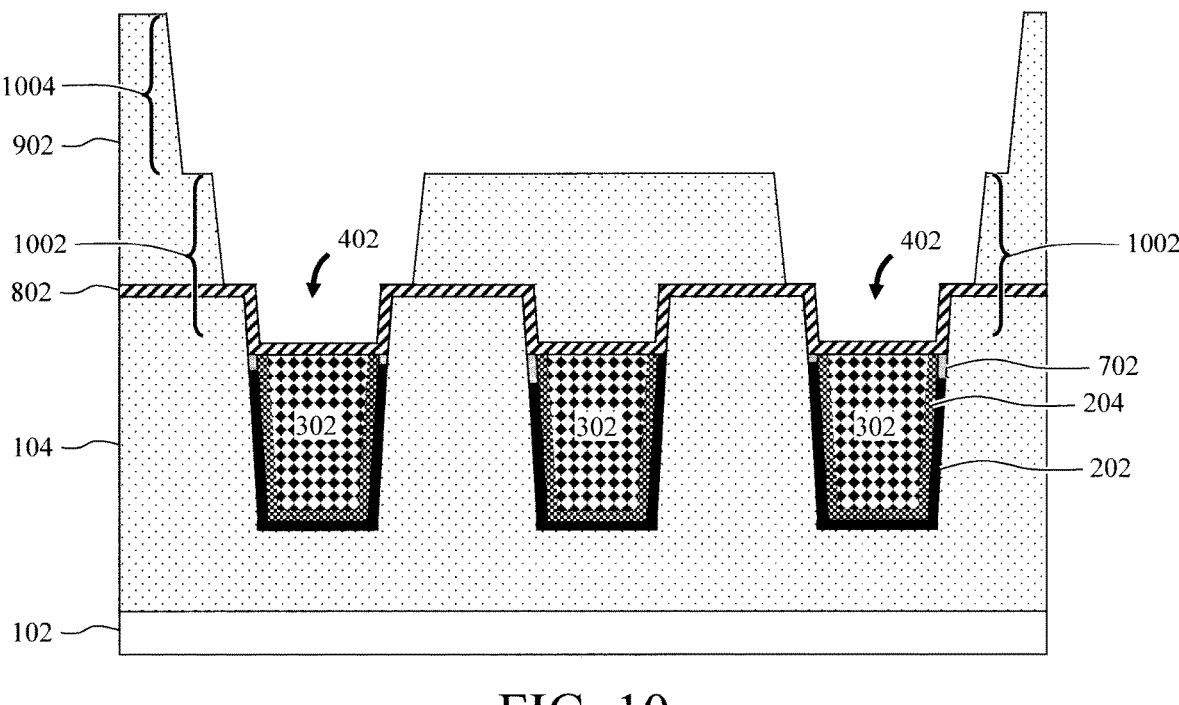
FIG. 10 is a cross-sectional diagram illustrating vias and a trench having been patterned in the second interlayer dielectric over the metal lines according to an embodiment of the present invention.

As shown in FIG. 10, a dual damascene process is implemented whereby features (vias and/or trenches) are patterned in the interlayer dielectric 902 over the metal lines 302. Standard lithography and etching techniques (see above) can be employed to pattern the features. In this particular example, a combination of vias 1002 and a trench 1004 are patterned in the interlayer dielectric 902. When the vias are patterned before the trench(es) in a dual damascene process, it is often referred to as a via-first approach. Conversely, when the trench(es) is/are patterned before the vias in a dual damascene process, it is often referred to as a trench-first process.

As shown in FIG. 10, dielectric cap 802 can serve as an etch stop during this patterning process. For instance, as provided above, the dielectric cap 802 can be formed from a nitride material, while the interlayer dielectric 902 can be formed from an oxide material. In that case, an oxide-selective etching process such as an oxide-selective reactive ion etch can be employed to pattern the vias 1002 and the trench 1004 in the interlayer dielectric 902 with dielectric cap 802 acting as an etch stop over the interlayer dielectric 104. Notably, by way of this process, the vias 1002 are self-aligned with the underlying metal lines 302. Namely, even though the vias 1002 landing on the dielectric cap 802 are wider than the metal lines 302 below, the dielectric cap 802 (acting as an etch stop) confines the vias 1002 to the gaps 402 over the metal lines 302.

Figure 11:
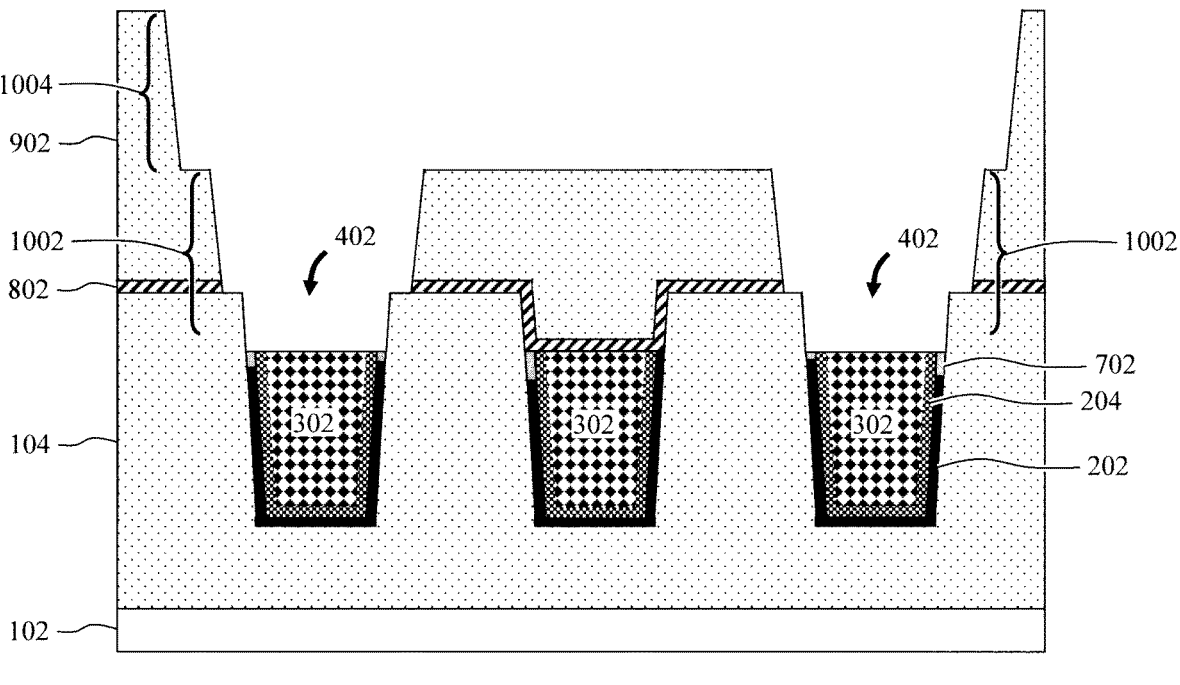
FIG. 11 is a cross-sectional diagram illustrating the dielectric cap having been removed from the vias according to an embodiment of the present invention.

As shown in FIG. 11, the dielectric cap 802 is then removed from the vias 1002 in order access the underlying metal lines 302. As provided above, the dielectric cap 802 can be formed from a nitride material. In that case, a non-directional (i.e., isotropic) etching process such as a nitride-selective wet chemical etch can be employed to remove the dielectric cap 802 from the vias 1002. The metal lines 302 are now exposed under the corresponding vias 1002. By contrast, one of the metal lines 302 will not be accessed by the trench 1004, and thus remains covered by the dielectric cap 802 and the interlayer dielectric 902.

Figure 12:
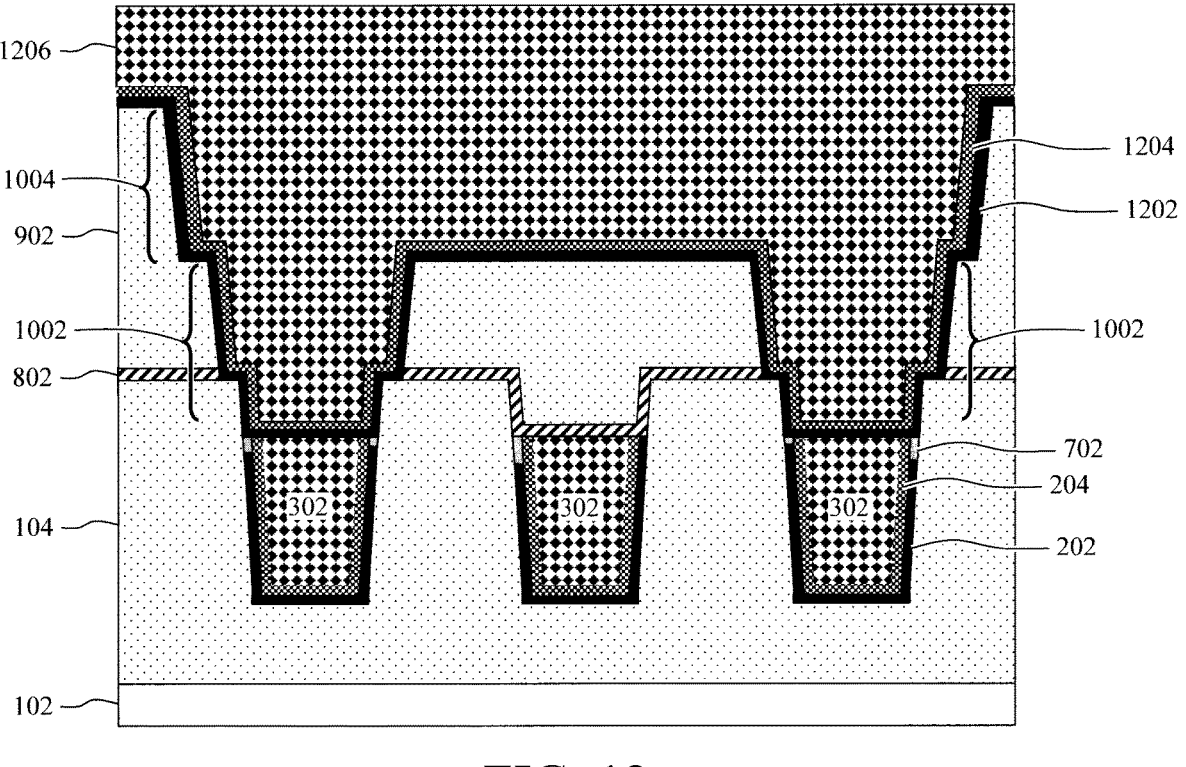
FIG. 12 is a cross-sectional diagram illustrating a (second) barrier layer having been deposited onto the second interlayer dielectric and into/lining the vias and the trench, a (second) liner having been deposited onto the second barrier layer, and a (second) fill metal having been deposited onto the second liner and filling the vias and the trench according to an embodiment of the present invention.

As shown in FIG. 12, a barrier layer 1202 is next deposited onto the interlayer dielectric 902 and into/lining the vias 1002 and the trench 1004, a liner 1204 is deposited onto the barrier layer 1202, and a fill metal 1206 is deposited onto the liner 1204 and filling the vias 1002 and the trench 1004. For clarity, the terms 'first' and 'second' may also be used herein when referring to the barrier layer 202/the liner 204/the fill metal 206 and the barrier layer 1202/the liner 1204/the fill metal 1206, respectively. The barrier layer 1202 and the liner 1204 conform to the topography of the interlayer dielectric 902 thus fully lining the vias 1002 and the trench 1004. Suitable barrier layer 1202 materials include, but are not limited to, Ti, Ta, TiN and/or TaN, which can be deposited using a process such as ALD. According to an exemplary embodiment, the barrier layer 1202 has a thickness of from about 1 nm to about 3 nm. The barrier layer 1202 serves to prevent diffusion of the fill metal 1206 into the surrounding interlayer dielectrics 104 and 902.

Suitable liner 1204 materials include, but are not limited to, Co, W and/or Ru, which can be deposited using a process such as ALD. According to an exemplary embodiment, the liner 1204 has a thickness of from about 1 nm to about 3 nm. The liner 1204 facilitates deposition of the fill metal 1206 into the vias 1002 and the trench 1004.

Suitable fill metals 1206 include, but are not limited to, Cu, Co, W and/or Ru, which can be deposited using a process such as evaporation, sputtering, or electrochemical plating. As shown in FIG. 12, the fill metal 1206, as-deposited, overfills the vias 1002 and the trench 1004, and thus is present over the top surface of the interlayer dielectric 902. However, the fill metal 1206 overburden will next be removed.

Figure 13:
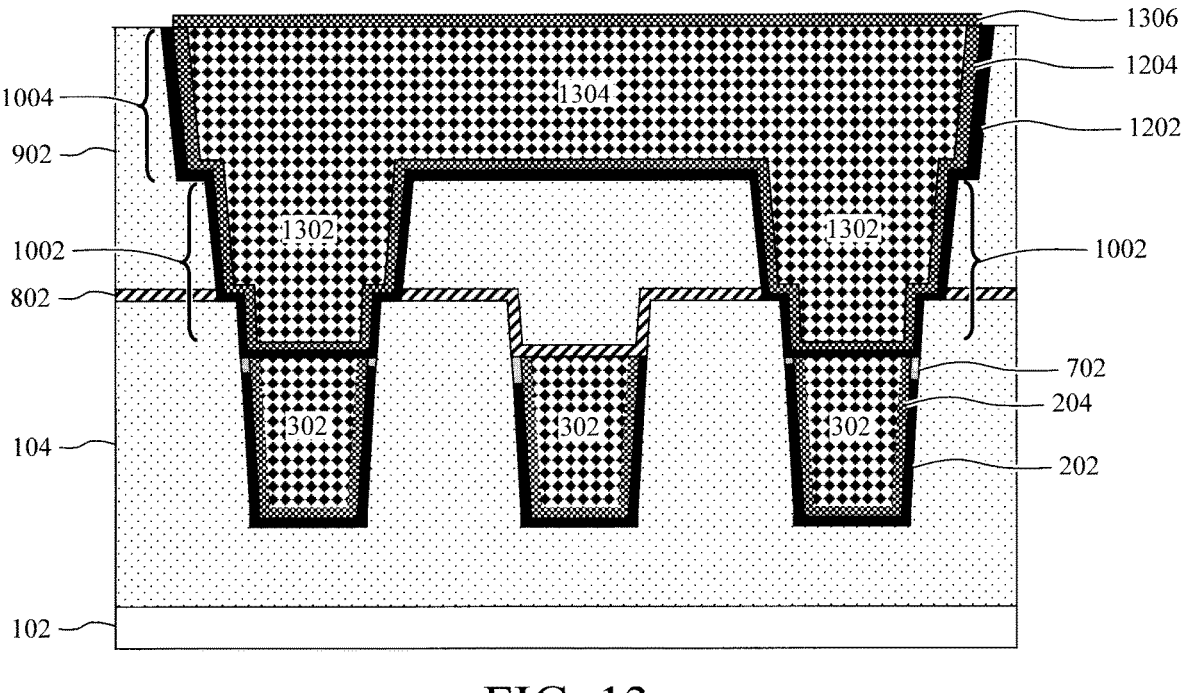
FIG. 13 is a cross-sectional diagram illustrating the second fill metal having been planarized thereby forming conductive vias and a metal line embedded in the second interlayer dielectric, and a metal cap having been formed on top of the metal line according to an embodiment of the present invention.

Namely, as shown in FIG. 13 the fill metal 1206 is planarized down to the top surface of the interlayer dielectric

902, thereby forming conductive vias 1302 in the vias 1002 and a metal line 1304 in the trench 1004, and a metal cap 1306 is formed on top of the metal line 1304. For clarity, the terms 'first' and 'second' may also be used herein when referring to the metal lines 302 and the metal line 1304, respectively. The metal lines 302 are embedded in the interlayer dielectric 104, while the conductive vias 1302 and the metal line 1304 are embedded in the interlayer dielectric 902. Planarization of the fill metal 1206 can be performed using a process such as chemical-mechanical polishing. As shown in FIG. 13, this planarization also serves to remove the barrier layer 1202 and the liner 1204 from the top surface of the interlayer dielectric 902. Thus, the top surface of the metal line 1304 is coplanar with the top surface of the interlayer dielectric 902.

Suitable metal cap 1306 materials include, but are not limited to, Co and/or Ru which can be deposited using a process such as CVD, evaporation, sputtering or electrochemical plating. According to an exemplary embodiment, the metal cap 1306 has a thickness of from about 2 nm to about 5 nm.

Figure 14:
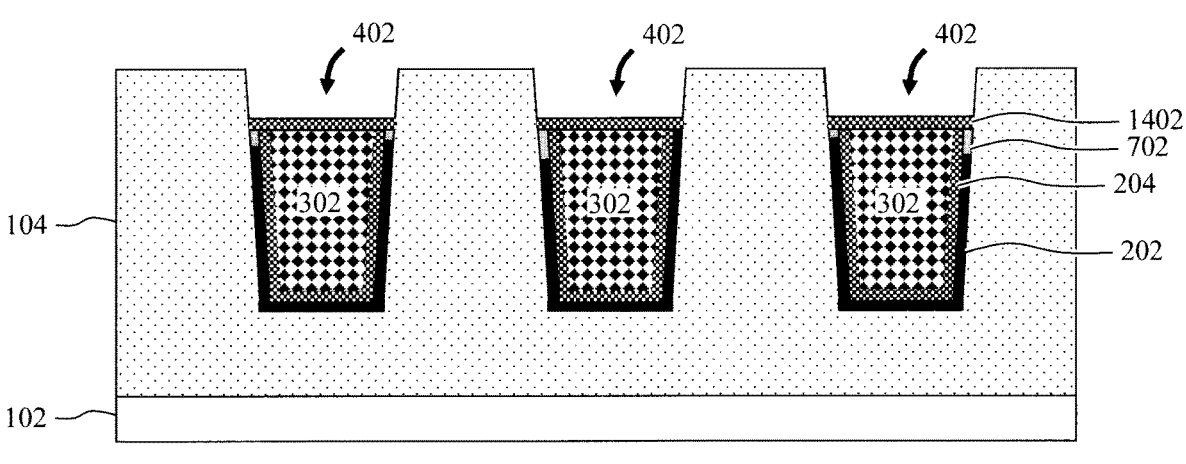
FIG. 14 is a cross-sectional diagram which follows from FIG. 7 illustrating, according to an alternative embodiment, metal caps having been formed on the metal lines after the protective dielectric layer has been formed in the divots according to an embodiment of the present invention.

As provided above, embodiments are contemplated herein where a metal cap is also implemented on the metal lines 302. Doing so, advantageously improves electromigration performance of Cu interconnects especially at advanced nodes. This alternate embodiment is now described by way of reference to FIGS. 14 and 15. The process begins in the same manner as described in conjunction with the description of FIGS. 1-7 above. Thus, what is depicted in FIG. 14 follows from the interconnect architecture shown in FIG. 7. Like structures are numbered alike in the figures. Further, following formation of the metal caps on the metal lines 302, the process is performed in the same manner as described above. As such, steps described in conjunction with multiple figures above are now combined into a single figure for brevity. Unless noted, the materials and fabrication processes employed are the same as those used in the previous example.

As shown in FIG. 14, in this alternate embodiment, metal caps 1402 are formed on the metal lines 302 after the protective dielectric layer 702 is formed in the divots 502. Suitable metal cap 1402 materials include, but are not limited to, Co and/or Ru, which can be deposited using a process such as CVD, evaporation, sputtering or electrochemical plating. According to an exemplary embodiment, the metal caps 1402 have a thickness of from about 2 nm to about 5 nm.

Figure 15:
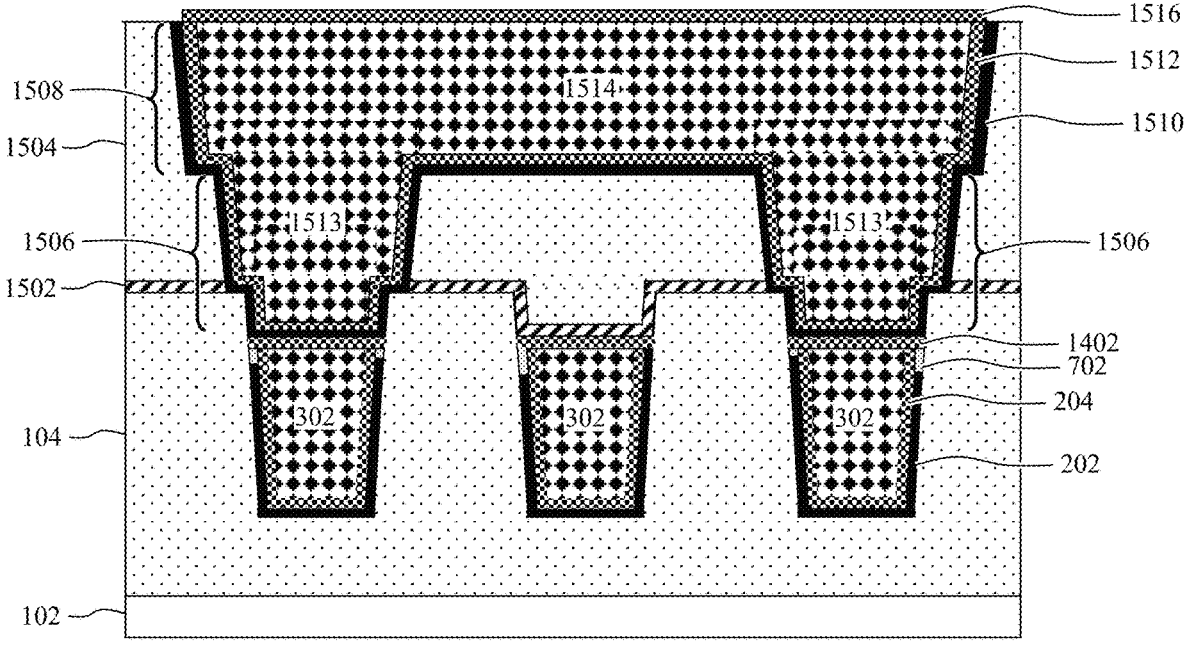
FIG. 15 is a cross-sectional diagram illustrating a dielectric cap having been deposited onto the first interlayer dielectric and the metal lines over the metal caps, a (second) interlayer dielectric having been deposited onto the first interlayer dielectric over the dielectric cap, vias and a trench having been patterned in the second interlayer dielectric, the dielectric cap having been removed from the vias, a (second) barrier layer and a (second) liner having been deposited into/lining the vias and the trench followed by a fill metal to form conductive vias and a metal line, and a metal cap having been formed on top of the metal line according to an embodiment of the present invention.

The remainder of the process is then performed in the same manner as with the previous example, except with the metal caps 1402 being present on the metal lines 302. Namely, as shown in FIG. 15, a dielectric cap 1502 (e.g., AlOx, SiN, SiC, SiCN, SiCO and/or SiON) is deposited as a single or multi-layer stack (see above) onto the interlayer dielectric 104 and the metal lines 302 over the metal caps 1402, a (second) interlayer dielectric 1504 (e.g., SiOC, SiCOH, SICNO, SICHNO, SiOx and/or pSiCOH) is deposited onto the interlayer dielectric 104 over the dielectric cap 1502, a dual damascene process is implemented whereby vias 1506 and a trench 1508 are patterned in the interlayer dielectric 1504 over the metal lines 302, the dielectric cap 1502 is removed from the vias 1506, a barrier layer 1510 (e.g., Ti, Ta, TiN and/or TaN) and a liner 1512 (e.g., Co, W and/or Ru) are deposited into/lining the vias 1506 and the trench 1508 followed by a fill metal (e.g., Cu, Co, W and/or Ru) to form conductive vias 1513 in the vias 1506 and a metal line 1514 in the trench 1508, and a metal cap 1516 (e.g., Co and/or Ru) is formed on top of the metal line 1514.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An interconnect structure, comprising:
a first interlayer dielectric disposed on a wafer;
at least one metal line embedded in the first interlayer dielectric, wherein a top surface of the at least one metal line is recessed below a top surface of the first interlayer dielectric;
a second interlayer dielectric disposed on the first interlayer dielectric;
at least one conductive via embedded in the second interlayer dielectric, wherein the at least one conductive via is aligned with the at least one metal line;
a barrier layer along a bottom and a first portion of a sidewall of the at least one metal line;
a protective dielectric layer along a second portion of the sidewall of the at least one metal line, wherein the barrier layer and the protective dielectric layer fully separate the at least one metal line from the first interlayer dielectric; and
a liner between and physically separating an entirety of the at least one metal line from the protective dielectric layer.

2. The interconnect structure of claim 1, wherein the protective dielectric layer comprises a different material from the barrier layer.

3. The interconnect structure of claim 1, wherein the protective dielectric layer comprises a material selected from the group consisting of: silicon nitride (SiN), silicon oxynitride (SiON), silicon carbon nitride (SiCN), silicon oxycarbonitride (SiOCN), and combinations thereof.

4. The interconnect structure of claim 1, wherein the barrier layer comprises a material selected from the group consisting of: titanium (Ti), tantalum (Ta), titanium nitride (TiN), tantalum nitride (TaN), and combinations thereof.

5. The interconnect structure of claim 1, wherein the liner comprises a material selected from the group consisting of: cobalt (Co), tungsten (W), ruthenium (Ru), and combinations thereof.

6. The interconnect structure of claim 1, further comprising:
a dielectric cap disposed on the first interlayer dielectric that separates the first interlayer dielectric from the second interlayer dielectric.

7. The interconnect structure of claim 6, wherein the dielectric cap comprises a material selected from the group consisting of: aluminum oxide (AlOx), SiN, silicon carbide (SiC), SiCN, silicon oxycarbide (SiCO), SiON, and combinations thereof.

8. An interconnect structure, comprising:
a first interlayer dielectric disposed on a wafer;
at least one metal line embedded in the first interlayer dielectric, wherein a top surface of the at least one metal line is recessed below a top surface of the first interlayer dielectric;
a metal cap disposed on the at least one metal line;

10 a second interlayer dielectric disposed on the first interlayer dielectric;
at least one conductive via embedded in the second interlayer dielectric, wherein the at least one conductive via is aligned with the at least one metal line;
a barrier layer along a bottom and a first portion of a sidewall of the at least one metal line; and
a protective dielectric layer along a second portion of the sidewall of the at least one metal line, wherein the barrier layer and the protective dielectric layer fully separate the at least one metal line from the first interlayer dielectric, and wherein a top surface of the protective dielectric layer directly contacts a bottom surface of the metal cap.

9. The interconnect structure of claim 8, wherein the metal cap comprises a material selected from the group consisting of: Co, Ru, and combinations thereof.

10. The interconnect structure of claim 8, wherein the protective dielectric layer comprises a different material from the barrier layer.

11. The interconnect structure of claim 8, wherein the protective dielectric layer comprises a material selected from the group consisting of: SiN, SiON, SiCN, SiOCN, and combinations thereof.

12. The interconnect structure of claim 8, wherein the barrier layer comprises a material selected from the group consisting of: Ti, Ta, TiN, TaN, and combinations thereof.

13. The interconnect structure of claim 8, further comprising:
a dielectric cap disposed on the first interlayer dielectric that separates the first interlayer dielectric from the second interlayer dielectric.

14. The interconnect structure of claim 13, wherein the dielectric cap comprises a material selected from the group consisting of: AlOx, SiN, SiC, SiCN, SiCO, SiON, and combinations thereof.

15. The interconnect structure of claim 1, wherein a top surface of the protective dielectric layer directly contacts a bottom surface of a second barrier layer of the at least one conductive via.

16. The interconnect structure of claim 1, wherein a top surface of the protective dielectric layer is substantially flush with a top surface of the at least one metal line.

17. The interconnect structure of claim 6, wherein a top surface of the protective dielectric layer directly contacts a bottom surface of the dielectric cap.

18. The interconnect structure of claim 8, further comprising:
a liner physically separating the at least one metal line from both the protective dielectric layer and the barrier layer, wherein a top surface of the liner directly contacts the bottom surface of the metal cap.

19. The interconnect structure of claim 8, wherein the top surface of the protective dielectric layer is substantially flush with the top surface of the at least one metal line.

* * * * *